United States Patent
Meyrueis et al.

(10) Patent No.: US 7,200,097 B2
(45) Date of Patent: Apr. 3, 2007

(54) PARALLEL RECORDING AND READING OF DIFFRACTIVE MEMORY USING MULTIPLE OBJECT BEAMS

(75) Inventors: Patrick Meyrueis, Strasbourg (FR);
Idriss El Hafidi, Strasbourg (FR);
Romualda Grzymala, Strasbourg (FR);
Renaud Kiefer, Hoenhaim (FR)

(73) Assignee: Research Investment Network, Inc., Long Beach, CA (US)

( * ) Notice: Subject to any disclaimer, the term of this patent is extended or adjusted under 35 U.S.C. 154(b) by 366 days.

(21) Appl. No.: 10/512,511

(22) PCT Filed: Apr. 26, 2002

(86) PCT No.: PCT/EP02/05445

§ 371 (c)(1),
(2), (4) Date: Oct. 25, 2004

(87) PCT Pub. No.: WO03/091995

PCT Pub. Date: Nov. 6, 2003

(65) Prior Publication Data

US 2005/0254392 A1    Nov. 17, 2005

(51) Int. Cl.
*G11B 7/00* (2006.01)
(52) U.S. Cl. ............... 369/103; 369/44.14; 369/112.01
(58) Field of Classification Search .................... None
See application file for complete search history.

(56) References Cited

U.S. PATENT DOCUMENTS

| 4,244,633 | A | * | 1/1981 | Kellie | 359/3 |
| 5,732,473 | A | * | 3/1998 | Gagnon | 33/270 |
| 6,293,898 | B1 | * | 9/2001 | Yang | 359/22 |

* cited by examiner

*Primary Examiner*—Muhammad Edun
(74) *Attorney, Agent, or Firm*—Steve A. Wong; Caroline T. Do

(57) ABSTRACT

A parallel recording of diffractive storage system is provided. The recorded information is cellular for its designation. A laser beam is data modulated through a single reference beam and a plurality of object beams positioned at different angles. These object beams intersect the reference beam within a recording medium to form a plurality of data loaded pattern simultaneously.

27 Claims, 4 Drawing Sheets

PARALLEL RECORDING AND READING OF DIFFRACTIVE MEMORY USING MULTIPLE OBJECT BEAMS

FIELD OF THE INVENTION

The present invention generally relates to photonics data memory devices. In particular, the present invention relates to fast access to photonics data memory devices using multiple object beams.

BACKGROUND OF THE INVENTION

There is a strong interest in high-capacity data storage systems with fast data access due to an ever-increasing demand for data storage. Limitations in the storage density of conventional magnetic memory devices have led to considerable research in the field of optical memories. Holographic memories have been proposed to supersede the optical disc (compact disc read only memories, or CD-ROMs, and digital video data, or DVDs) as a high-capacity digital storage medium. The high density and speed of holographic memory results from the use of three-dimensional recording and from the ability to simultaneously read out an entire page of data. The principal advantages of holographic memory are a higher information density, a short random-access time, and a high information transmission rate.

In holographic recording, a light beam from a coherent monochromatic source (e.g., a laser) is split into a reference beam and an object beam. The object beam is passed through a spatial light modulator (SLM) and then into a storage medium. The SLM forms a matrix of cells that modulate light intensity with grey levels. The SLM forms a matrix of shutters that represents a page of binary or grey-level data. The object beam passes through the SLM, which acts to modulate the object beam with binary information being displayed on the SLM. The modulated object beam is directed to one point, after an appropriate beam processing, where it intersects with the reference beam after being routed by an addressing mechanism. It is also contemplated that for polychromatic holography, the polychromatic hologram may be recorded with more than one wavelength from different lasers or from the same multiline laser at the same time. In other words, the recording can be operating with several wavelengths in the holographic multiplexing process.

An optical system consisting of lenses and mirrors is used to precisely direct the optical beam encoded with the packet of data to the particular addressed area of the storage medium. Optimum use of the capacity of a thick storage medium is realized by spatial and angular multiplexing that can be enhanced by adding frequency polarization, phase multiplexing, etc. In spatial multiplexing, a set of packets is stored in the storage medium and shaped into a plane as an array of spatially separated and regularly arranged subholograms by varying the beam direction in the X-axis and Y-axis of the plane. Each subhologram is formed at a point in the storage medium with the rectangular coordinates representing the respective packet address as recorded in the storage medium. In angular multiplexing, recording is carried out by keeping the X- and Y-coordinates the same while changing the irradiation angle of the reference beam in the storage medium. By repeatedly incrementing the irradiation angle, a plurality of packets of information is recorded as a set of subholograms at the same X- and Y-spatial location.

A volume (thick) hologram requires a thick storage medium, typically a three-dimensional body made up of a material sensitive to a spatial distribution of light energy produced by interference of a coherent light beam and a reference light beam. A hologram may be recorded in a medium as a variation of absorption or phase or both. The storage material responds to incident light modulation patterns causing a change in its optical properties. In a volume hologram, a large number of packets of data can be superimposed, so that every packet of data can be reconstructed without distortion. A volume (thick) hologram may be regarded as a superposition of three-dimensional gratings recorded in the depth of the emulsion, each satisfying the Bragg law (i.e., a volume phase grating). The grating planes in a volume hologram produce changes in refraction and/or absorption.

While holographic storage systems have not yet replaced current compact disc (CD) and digital video data (DVD) systems, many advances continue to be made which further increase the potential of storage capacity of holographic memories. This includes the use of various multiplexing techniques such as angle, wavelength, phase-code, fractal, peristrophic, and shift. However, methods for recording information in highly multiplexed volume holographic elements, and for reading them out, have not proved satisfactory in terms of throughput, crosstalk, and capacity.

Currently, one object beam and multiplexing (i.e., angular multiplexing) of a reference beam are used in holographic memory recording. Therefore, to access one packet of data, it is necessary to record and read with a specific reference angle. This is time-consuming, since the recording is done sequentially for all angles of the reference beam.

BRIEF DESCRIPTION OF THE DRAWINGS

In order to facilitate a fuller understanding of the present invention, reference is now made to the appended drawings. These drawings should not be construed as limiting the present invention, but are intended to be exemplary only.

DETAILED DESCRIPTION OF THE INVENTION

The present invention introduces the use of one reference beam and several object beams for recording and reading holographic memory. The use of multiple object beams allows parallel recording and reading at a high speed. The parallel recording and reading are achieved by moving and scanning a recording medium respectively, using one reference beam. The addressing of one point allows one to read a plurality of packets located in that one point. The use of multiple object beams in the recording system reduces the recording time by a factor of the angular multiplexing number (of the reference beam). Furthermore, it would eliminate the use of rotating mirrors to angular multiplexing of the reference beam. By the same token, the access time in reading data from the recorded memory is also reduced by a factor of the angular multiplexing number. Furthermore, it may be that just one acousto optic associated to amplification grating is needed to read all matrices, and the rotating actuator in a traditional reading system may be eliminated.

Further advantages and novel features of the present invention will become apparent to those skilled in the art from this disclosure, including the following detailed description, as well as by practice of the invention. While the invention is described below with reference to illustrative embodiments, this description is not intended to be construed in a limiting sense. Those of ordinary skill in the art having access to the teachings herein will recognize additional implementations, modifications, and embodiments, as well as other fields of use, which are within the scope of the invention as disclosed and claimed herein, and with respect to which the invention could be of significant utility.

Storing/Recording Phase

Figure 1A:
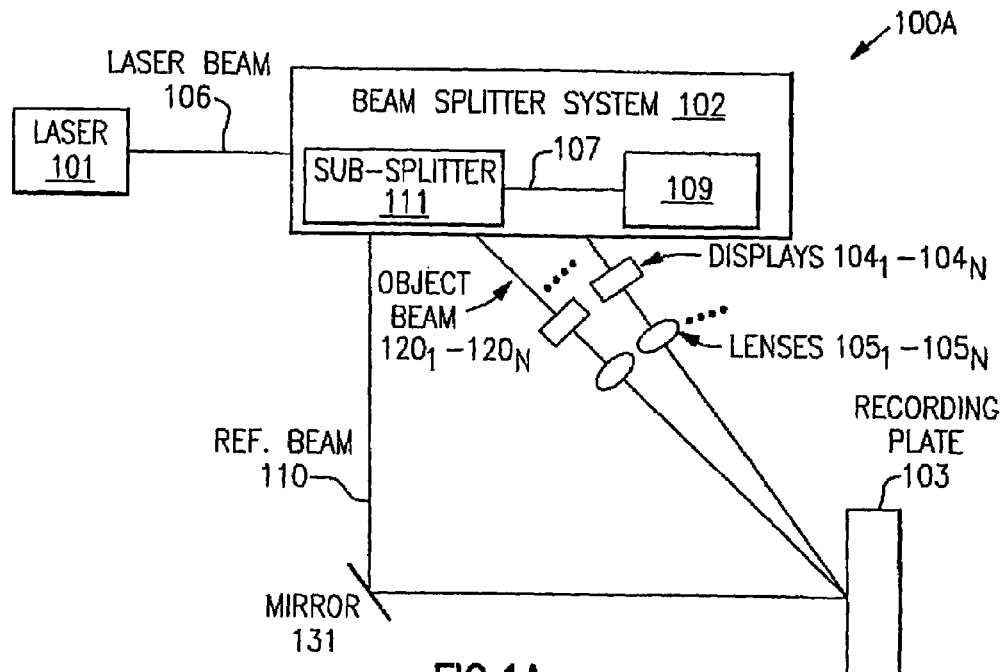
FIGS. 1A and 1B are schematic representations of an apparatus for recording multiple holograms in accordance with one embodiment of the invention.
Figure 1B:
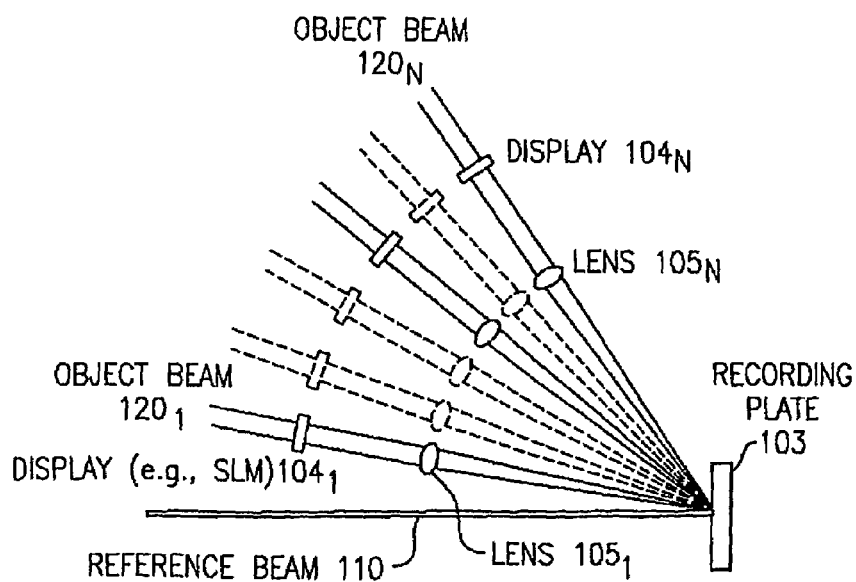

Referring to FIGS. 1A and 1B, there are shown schematic representations of an apparatus for holographic recording using one reference beam and a plurality of object beams. The system 100A includes a laser 101, a beam splitter system 102, a recording medium 103, a plurality of displays $104_1$ to $104_N$ (where N is a positive integer), and a plurality of lenses $105_1$ to $105_N$.

The laser 101 provides a laser beam 106 (i.e., coherent light beam) to the beam splitter system 102. In one embodiment, the laser 101 is a YAG doubled laser, i.e., a solid state laser. A rod of YAG material emits laser light in the infrared to the laser 101. The laser light associates with a nonlinear crystal that produces double the YAG-emitted light frequency. The laser beam 106 emanating from laser 101 is split into a reference beam 110 and a main object beam 107 (shown in FIGS. 2A and 2B) by the sub-splitter 111, which are then split into a plurality of object beams $120_1$ to $120_N$. The main object beam 107 is split into a plurality of object beams $120_1$ to $120_N$ by a multiple beam splitter 109. The multiple beam splitter 109 may be internal or external to the beam splitter system 102. In one embodiment, the multiple beam splitter 109 is a diffractive optic element (DOE) and in another embodiment the multiple beam splitter 109 includes a cascade of beam splitters $130_1$ to $130_{N-1}$, as shown in FIG. 2A, and a mirror 131.

Figure 2A:
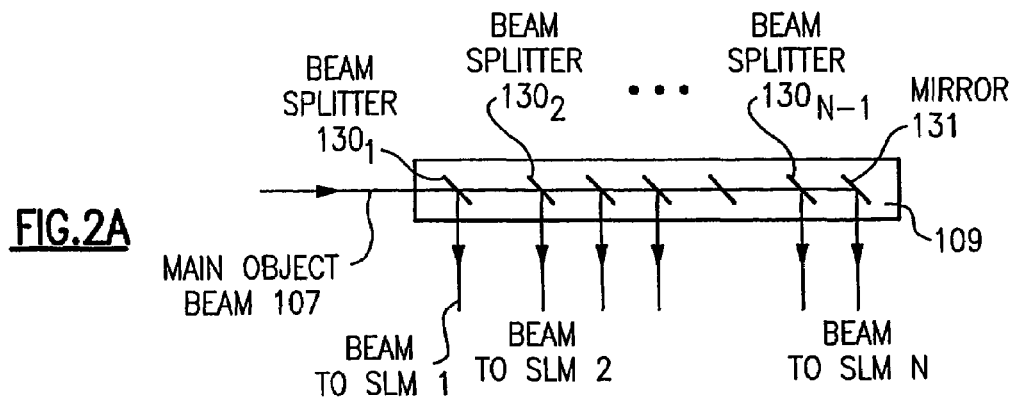
FIG. 2A is a schematic representation of the beam splitting device using a cascade of beam splitters in accordance with one embodiment of the invention.

Referring to FIG. 2A, there is shown a schematic representation of a multiple beam splitter 109 as a cascade of beam splitters according to one embodiment of the invention. The beam device 109 includes a plurality of cascade beam splitters $130_1$ to $130_{N-1}$ and the mirror 131. The main object beam 109, split from the laser beam 107, is then split into the plurality of object beams $120_1$ to $120_N$ by the multiple beam splitter 109 (i.e., cascade of beam splitters and mirror). The beam splitting power is controlled to have the same beam intensities routed to the SLMs set. The light-split intensity depends on the reflectivity of the coated layer on the splitter substrate. In one embodiment, every object beam has the same photonic power so that every SLM can receive approximately the same light power. In other words, this provides basically the same splitted power to each beam addressing the set of SLMs. Every recorded plate recording substrate with the same intensity on each of the charge-coupled devices (CCDs), every recorded plate provides a set of packets with the same energy due to the same-recorded effect on the recording substrate.

As described above, the splitting may be done by means of diffractive grating or by a cascade of beam splitters. The high-density main object beam 107 is equally split on every SLM. This splitting provides every SLM with an equal light power. After the data is loaded by every SLM on each split laser beam, they are focused by the set of lenses $105_1$ to $105_N$ onto the same point on the recorded substrate of the recording medium 103.

In the case where the energy level of each object beam does not match one another, adjusting the sensitivity of each SLM device is possible. Furthermore, if the energy level of each beam is different, optical attenuators may be selected to adapt jointly to the energy on the beam and the sensitivity of the SLMs. One SLM in the plurality of SLMs is a "master" SLM for the other SLMs. The light power is adjusted on the reference of this master light by using attenuators. Every attenuator is adapted for different beams. The optical density of the attenuator is adapted to the power available on the SLMs. For example, if one SLM receives energy differently from its neighbor SLM, an attenuator is used to adjust the energy on the neighbor SLM so that the intensity of the image supporting the recorded packet is the same. This provides uniform intensity of the packet of data read.

Figure 2B:
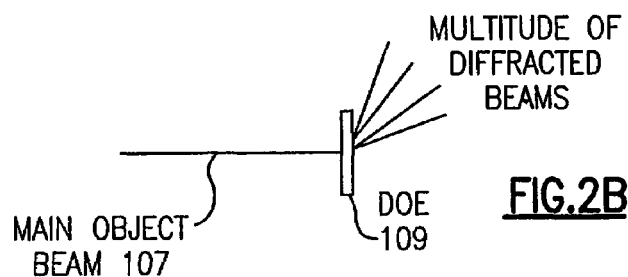
FIG. 2B is a schematic representation of a beam splitting device using a diffractive optic element in accordance with one embodiment of the invention.

Referring to FIG. 2B, there is shown a schematic representation of the diffractive optical element (DOE) as the multiple beam splitter 109 according to one embodiment of the invention. The main object beam 107 is split from the laser beam 106 and is emitted to the DOE 109. The DOE 109 produces a multitude of diffracted beams (i.e., object beams $120_1$ to $120_N$). These diffractive beams are routed to arranged mirrors (not shown) and to the SLMs set individually.

The recording medium 103 has a plurality of cells to hold the recorded information. The recording medium 103 is a plate holographic memory device that contains information stored during a phase of storing information. The recording (i.e., storage) medium is typically a three-dimensional body made up of a material sensitive to a spatial distribution of light energy produced by interference of the object beams $120_1$ to $120_N$ and the reference light beam 110. A hologram may be recorded in a medium as a variation of absorption or phase or both. The storage material responds to incident light modulated patterns causing the change in its optical properties. In a volume (thick) hologram, a large number of packets of data can be superimposed, so that every packet of data can be reconstructed without distortion. A volume hologram may be regarded as a superposition of three-dimensional gratings recorded in the depth of the layer of the recording material, each satisfying the Bragg law (i.e., a volume phase grating). The grating modulation in a volume hologram produces change in refraction and/or absorption. The recording medium 103 may be arranged in the form of a flat layer, herein referred to as a matrix. Each of a plurality of points on the matrix is defined by its rectilinear coordinates (X,Y). A point in physical space, defined by its rectilinear coordinates, contains a plurality of packets.

In one embodiment, the recording medium 103 is constructed of organic material, such as a polypeptide material, and made in accordance with the techniques described in the co-pending patent application entitled "Photonics Data Storage System Using a Polypeptide Material and Method for Making Same," Serial No. PCT/FR01/02386, which is herein incorporated by reference.

The plurality of object beams $120_1$ to $120_N$, pass through the plurality of displays (e.g., SLMs) $104_1$ to $104_N$ and then into the storage medium 103. In other words, each object beam is loaded with data by its corresponding display, and that display is illuminated by the main object beam 107 after splitting by the multiple beam splitter 109. The object beams $120_1$ to $120_N$, are positioned at different angles. Each display of the plurality of displays $104_1$ to $104_N$ forms a matrix of shutters that represents a packet of binary data. The object beams $120_1$ to $120_N$ may be filtered and collimated. The object beams $120_1$ to $120_N$ are directed to the displays $104_1$ to $104_N$, which display images to be recorded. The object beams $120_1$ to $120_N$ become modulated by the information to be recorded by means of reflection off or transmission through the displays $104_1$ to $104_N$.

The displays $104_1$ to $104_N$ may be any devices for displaying data packets in a system, such as spatial light modulators (SLMs) or liquid crystal light valves (LCLVs). In one embodiment, the plurality of bits represented on the display screen of the displays $104_1$ to $104_N$ is presented as a two-dimensional pattern of transparent and opaque pixels (i.e., data packet). The data packet displayed is derived from any source such as a computer program, the Internet, and so forth. In an Internet storage application, the packets displayed may be formatted similarly to the packets of the Internet.

The reference laser beam 110 interferes coherently with the object beams $120_1$ to $120_N$ to form the interference patterns or holograms, which are stored in the recording medium 103 due to the perturbation in the refractive index. Thus, each hologram is stored at a unique angle of the object beams $120_1$ to $120_N$. The separation between the various holograms stored within the same volume relies on the cross talk separation and angular tolerancing, in order to allow its retrieval only for a defined angle value.

As stated above, the object beams $120_1$ to $120_N$ pass through the displays $104_1$ to $104_N$, which act to modulate the object beams $120_1$ to $120_N$ with the binary information. The object beams $120_1$ to $120_N$ are then directed to a defined point on the recording medium 103 where they intersect with the reference beam to create a plurality of holograms representing packets of data. The plurality of lenses $105_1$ to $105_N$ is used to converge the modulated object beams $120_1$ to $120_N$ and to focus the beams to the recording medium 103. In other words, the modulated beams $120_1$ to $120_N$ become reduced by means of suitable lenses $105_1$ to $105_N$ so that the point of convergence of the modulated object beams $120_1$ to $120_N$ lies slightly beyond the recording medium 103. The object beams $120_1$ to $120_N$ are positioned at different angles so that plurality of data packets is recorded at one point of the recording medium 103. The different angle is calculated or adjusted to a position to avoid crosstalk between two output neighboring beams.

Figure 3A:
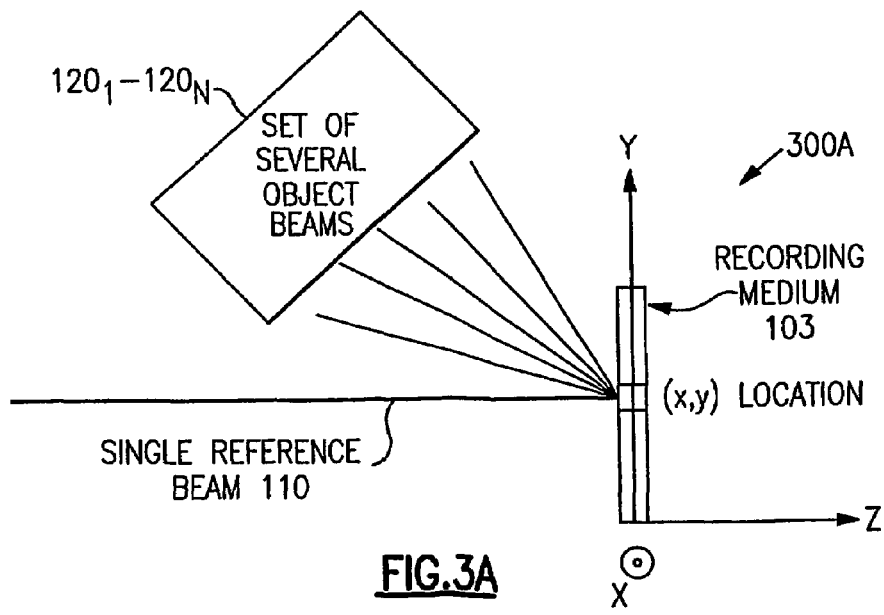
FIG. 3A is a schematic representation of the apparatus shown in FIG. 1 for recording multiple holograms in accordance with one embodiment of the invention.

Referring to FIG. 3A, there is shown a more detailed schematic representation of the apparatus shown in FIG. 1 for holographic recording using multiple object beams. The system 300 includes the single reference beam 110, the set of several object beams $120_1$ to $120_N$, and the recording medium 103. The reference beam 110 and the object beams $120_1$ to $120_N$ intersect to form patterns to be recorded on the recording medium 103 at an X,Y location. In other words, for one X,Y location, the recording is done by one reference beam and several object beams intersect. Each object beam is oriented according to a specific angle so that it can be focused on one point in the recording medium 103. The object beams $120_1$ to $120_N$ are positioned at different angles, similar to the way the reference beam is angularly multiplexed in the previous recording system using angular multiplexing for the reference beam. All the multiplexed object beams $120_1$ to $120_N$ are recorded simultaneously at one point by using one reference beam 110. To go to the next recording point, the recording medium is moved in X, Y direction by a moving system (not shown). This is the spatial multiplexing that is carried out by sequentially changing the rectilinear coordinates. The plurality of object beams $120_1$ to $120_N$ focus on the recording medium 103 so that N number of separate images are recorded at a unique position in a plane defined by its coordinates (X,Y).

Figure 3B:
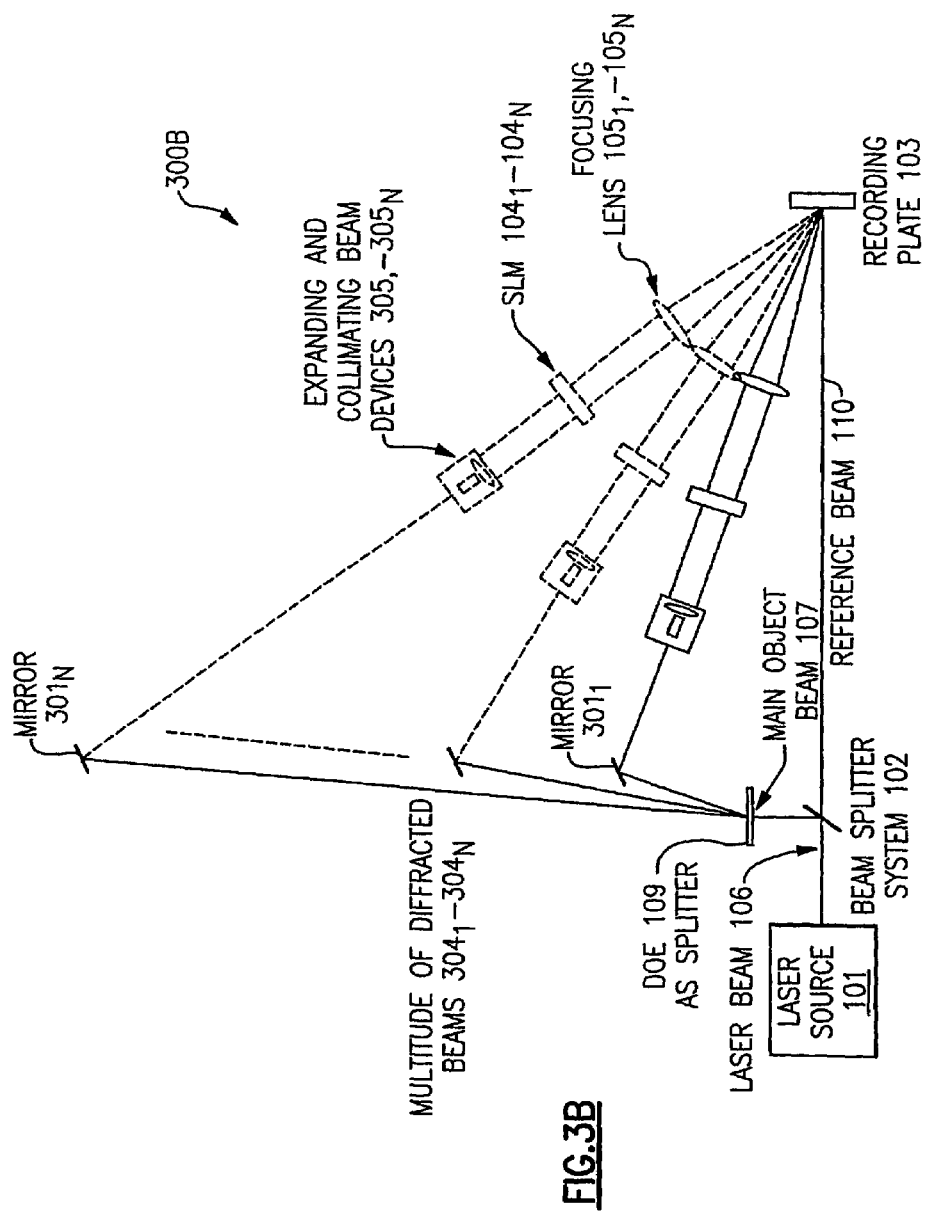
FIG. 3B is a schematic representation of a recording system using a DOE as splitter in accordance with one embodiment of the invention.

Referring to FIG. 3B, there is shown a recording system 300B using a DOE as splitter to generate multiple diffractive beams in accordance with one embodiment of the invention. The system 300 includes the laser source 101, the beam splitter system 102, the DOE 109, a plurality of mirrors $301_1$ to $301_N$, a plurality of expanding and collimating beam devices $305_1$ to $305_N$, the plurality of displays $104_1$ to $104_N$, the plurality of focusing lenses $105_1$ to $105_N$, and the recording plate 103.

The functions and characteristics of the laser source 101, the beam splitter 102, the displays $104_1$ to $104_N$, the focusing lenses $105_1$ to $105_N$, and the recording plate 103 are already described above. The DOE 109 produces a plurality of multitude of diffracted beams $304_1$ to $304_N$. The plurality of mirrors $301_1$ to $301_N$ directs the beams to the plurality of corresponding expanding and collimating beam devices $305_1$ to $305_N$ for expanding and collimating the multiple diffracted beams. The expanded and collimated beams pass through the displays $104_1$ to $104_N$ to become a plurality of object beams which intersect with the reference 110 at a point on the recording plate 103 to form a plurality of data packets.

Reading Phase

Figure 4:
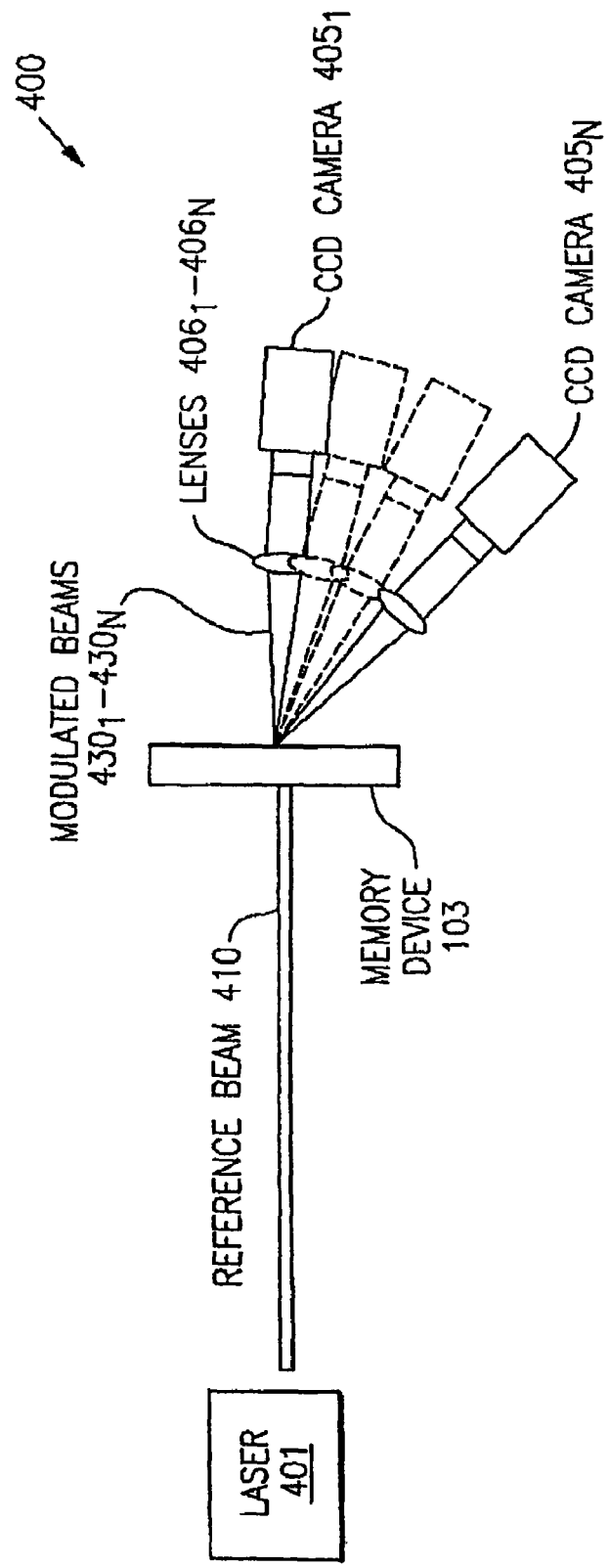
FIG. 4 is a schematic representation of the apparatus for reading multiple holograms in accordance with one embodiment of the invention.

Referring to FIG. 4, there is shown a schematic representation of an apparatus for holographic reading using one reference beam to read a plurality of packets simultaneously. The system 400 includes a laser 401 (e.g., laser 101), the recording medium 103, a plurality of image sensors (i.e., phototransistor devices, CCDs) $405_1$ to $405_N$, and a plurality of lenses $406_1$ to $406_N$. The laser 401 emits a coherent light beam 410 (i.e., reading/reference beam) to the recording medium 103. The reference beam 410 may be the same as the reference beam 110. The recording medium 103 has a plurality of cells that hold the recorded information Retrieving the recorded/stored information from the diffractive memory device 103 requires the use of the reference beam 410 (i.e., read beam) whose characteristics correspond to those employed for writing (i.e., reference beam 110) or for storage. The reference beam 410 induces diffraction in the polypeptide layer due to perturbation in the refractive index corresponding to the characteristics of the beams interference, thereby creating a plurality of stored packets related to modulated beams $430_1$ to $430_N$.

The reference beam 410 is positioned in order to access a plurality of data packets contained at a defined point (X,Y) on the matrix in the recording medium 103. The reading procedure is similar to the writing or recording procedure. However, the reading procedure may be carried out with a greater degree of tolerance than the recording procedure. It is possible to use a very compact laser source of a solid-state type for the reading process because the laser power necessary for reading is much lower than the one for recording.

The plurality of data packets in the diffractive memory device 103 are reconstructed simultaneously by shining the reference beam 410 at the same location in which the data packets were recorded. The reference beam 410 diffracted by the diffractive memory device 103 forms the reconstruction, which is detected by the plurality of arrays of image sensors $405_1$ to $405_N$. The reference beam 410 is configured to address the plurality of packets at different locations in the diffractive memory device 103. The plurality of lenses $406_1$ to $406_N$ are positioned at different angles to focus output beams produced by the diffraction of the reference beam 410 onto the image sensors $405_1$ to $405_N$. In one embodiment, the reference beam 410 is positioned perpendicular to the recording plate for recording. Therefore, there is no angular deflection in parallel reading. The read beam is diffracted for the reading into plurality of channels simultaneously. Every channel is materialized by an output beam loaded with a data packet that is positioned with a programmed angular value. This angular value is fitted to angular positioning of the beam used to record, data from the displays $104_1$ to $104_N$. The X,Y scanning is performed to proceed from one point to the next for the next reading of information on the diffractive memory device 103 diffracted and from there the output packets are focused.

The laser reference beam (i.e., reading beam) 410 is shaped and directed onto the recorded medium 103 and from there focused by imaging lenses $406_1$ to $406_N$ onto image sensors (e.g., CCD cameras) $405_1$ to $405_N$, each of which has a number of pixels adapted to the desired resolution. The digital output of the image sensors $405_1$ to $405_N$ is further processed by a computer (not shown).

The reference beam 410 (i.e., read beam) emanates from the low-power laser 401. Typically the reference beam is less than 5 mW. The laser 401 may be a helium-neon or semiconductor-type laser. The reference beam 410 may be modulated by means of one or more transformation activators (not shown) lying in the optical path of the beam for reading data recorded in a plurality of points.

The present invention is not to be limited in scope by the specific embodiments described herein. Indeed, this application is intended to cover any modifications of the present invention, in addition to those described herein, and the present invention is not confined to the details which have been set forth. Thus, the scope of the invention should be determined by the appended claims and their legal equivalents, rather than by the examples given.

What is claimed is:

1. An apparatus comprising: a recording medium for recording information designated to a cell; a laser for transmitting a single reference beam to the recording medium; and a multiple beam splitter for transmitting a plurality of object beams to the recording medium at different angles, the object beams intersecting the reference beam within the recording medium to form a plurality of patterns.

2. The apparatus according to claim 1 further comprising a plurality of displays for displaying the information to be recorded, the object beams being modulated by reflection off or transmission through the displays.

3. The apparatus according to claim 2 further comprising a plurality of lenses for converging the modulated object beams and focusing the modulated beams to a point on the recording medium.

4. The apparatus according to claim 2 wherein the displays are spatial light modulators (SLMs).

5. The apparatus according to claim 1 wherein the recording medium is a holographic plate memory device.

6. The apparatus according to claim 1 wherein the cell includes the plurality of interference patterns.

7. The apparatus according to claim 1 wherein the recording medium is made of polypeptide material.

8. An apparatus comprising: a recording medium for recording information designated to a cell; a laser for transmitting a single reference beam to the recording medium; and a multiple beam splitter for transmitting a plurality of object beams to the recording medium at different angles, the object beams simultaneously intersecting the reference beam within the recording medium to form a plurality of patterns.

9. An apparatus comprising: a recording medium for recording information designated to a cell; a laser for transmitting a single reference beam to the recording medium; a multiple beam splitter for transmitting a plurality of object beams to the recording medium at different angles, the object beams intersecting the reference beam within the recording medium to form a plurality of patterns; and a plurality of displays for displaying the information to be recorded, the object beams being modulated by reflection off or transmission through the displays.

10. An apparatus comprising: a recording medium for recording information designated to a cell; a beam splitter system for transmitting a single reference beam to the recording medium; an multiple beam splitter for simultaneously transmitting a plurality of object beams to the recording medium at different angles, the object beams intersecting the reference beam within the recording medium to form a plurality of patterns; and a plurality of displays for displaying the information to be recorded, the object beams beg modulated by reflection off or transmission through the displays.

11. A method comprising: transmitting a single reference beam to a recording medium; positioning a plurality of object beams at different angles; transmitting a plurality of object beams to the recording medium; and intersecting the reference beam and the plurality of object beams within a cell in the recording medium to form a plurality of patterns.

12. The method according to claim 11 further comprising: displaying information to be recorded on a plurality of displays; and modulating the object beams by reflecting off or transmitting the information through the displays.

13. The method according to claim 12 further comprising converging the modulated object beams.

14. The method according to claim 13 wherein the recording medium is a holographic plate memory device.

15. The method according to claim 12 wherein the displays are spatial light modulators.

16. The method according to claim 11 wherein the data loaded on the object beams are stored through the plurality of interference patterns.

17. The method according to claim 11 wherein the recording medium is made of polypeptide material.

18. A method comprising: transmitting a single reference beam to a recording medium; arranging a plurality of object beams at different angles; simultaneously transmitting a plurality of object beams to the medium; and intersecting the reference beam and the plurality of object beams within a cell in the recording medium to form a plurality of patterns.

19. A method comprising: transmitting a single reference beam to a recording medium; arranging a plurality of object beams at different angles; transmitting a plurality of object beams to the medium; intersecting the reference beam and the plurality of object beams within a cell in the recording medium to form a plurality of patterns; and displaying information to be recorded on a plurality of displays.

20. The method according to claim 19 further comprising modulating the object beams by reflecting off or transmitting the information through the displays.

21. The method according to claim 20 further comprising converging the modulated object beams.

22. An apparatus comprising: a memory device including a cell for containing recorded information; a beam splitter system for transmitting a single reference beam to the memory device to read the recorded information; and a multiple beam splitter for transmitting a plurality of object beams to the recording medium at different angles, the object beams intersecting the reference beam within the recording medium to form a plurality of patterns.

23. The apparatus of claim 22 wherein the multiple beam splitter is a diffractive optic element.

24. The apparatus of claim 22 wherein the multiple beam splitter is a cascade of beam splitters.

25. An apparatus comprising: a photonics data memory device having a plurality of patterns; a beam splitter system for transmitting a single reference beam to the memory device to read output data packets stored through the plurality of patterns; a plurality of lenses for forming images produced by diffraction of the patterns; and means for converting the images into electrical signals.

26. The apparatus according to claim 25 wherein means for converting are a plurality of CCDs (charge-coupled devices).

27. The apparatus according to claim 25 further comprising a computer for processing and analyzing the electrical signals.

* * * * *